(12) United States Patent
Chang

(10) Patent No.: US 6,842,347 B2
(45) Date of Patent: Jan. 11, 2005

(54) DATA PROCESSING SYSTEM AND ASSOCIATED CONTROL CHIP AND PRINTED CIRCUIT BOARD

(75) Inventor: Nai-Shung Chang, Taipei Hsien (TW)

(73) Assignee: Via Technologies, Inc., Taipei Hsien (TW)

(*) Notice: Subject to any disclaimer, the term of this patent is extended or adjusted under 35 U.S.C. 154(b) by 391 days.

(21) Appl. No.: 10/127,044

(22) Filed: Apr. 19, 2002

(65) Prior Publication Data

US 2002/0156538 A1 Oct. 24, 2002

Related U.S. Application Data

(60) Provisional application No. 60/285,028, filed on Apr. 19, 2001.

(30) Foreign Application Priority Data

Nov. 1, 2001 (TW) .................................... 90127124 A

(51) Int. Cl.[7] .................................................. H05K 7/06
(52) U.S. Cl. ...................... 361/780; 361/783; 361/794; 361/803; 257/700; 257/723
(58) Field of Search ................................ 361/760, 767, 361/768, 780, 783, 788, 794, 803; 257/691, 700, 723, 724

(56) References Cited

U.S. PATENT DOCUMENTS

6,407,930 B1 * 6/2002 Hsu .......................... 361/784
6,456,502 B1 * 9/2002 Miller et al. ................ 361/760

* cited by examiner

Primary Examiner—John B. Vigushin
(74) Attorney, Agent, or Firm—J.C. Patents

(57) ABSTRACT

A data processing system including a control chip, a central processing unit and a printed circuit board is provided. In the data processing system, the printed circuit board not only supports the control chip and the central processing unit, but also serves as an interface for transferring signals between the control chip and the central processing unit. Critical signals can be transmitted from the central processing unit to the control chip via the printed circuit with a better return path.

9 Claims, 3 Drawing Sheets

DATA PROCESSING SYSTEM AND ASSOCIATED CONTROL CHIP AND PRINTED CIRCUIT BOARD

CROSS-REFERENCE TO RELATED APPLICATION

This application claims the priority benefit of U.S. provisional application titled "SUBSTRATE LAYOUT METHOD" filed on Apr. 19, 2001, Ser. No. 60/285,028. All disclosures of this application is incorporated herein by reference. This application also claims the priority benefit of Taiwan application serial no. 90127124, filed Nov. 1, 2001.

BACKGROUND OF THE INVENTION

1. Field of Invention

The present invention relates to a data processing system and operating method. More particularly, the present invention relates to a data processing system and operating method that facilitates the maintenance of a set of uniform reference layers among a central processing unit, a control chip and a printed circuit board.

2. Description of Related Art

FIG. 1 is a schematic diagram showing a conventional signal transmission wiring system between a central processing unit 100, a north bridge 200 and a printed circuit board (PCB) 300. As shown in FIG. 1, the central processing unit 100 includes a chip 102 and a substrate having a stack structure 106. The stack structure 106 within the central processing unit 100 includes, from top to bottom, a signal layer 108, a ground layer 110, a power source layer 112 and a signal layer 114. The north bridge 200 or the printed circuit board 300 respectively has its own substrate that further including associated stack structure. The stack structure within the north bridge 200 includes, from top to bottom, a signal layer 206, a power source layer 208, a ground layer 210 and a signal layer 212. Similarly, the stack structure within the printed circuit board 300 includes, from top to bottom, a signal layer 302, a power source layer 304, a ground layer 306 and a signal layer 308. The north bridge 200 further includes a chip 201 above the substrate 202.

According to FIG. 1, the signal layer 212 of the north bridge 200 and the signal layer 114 of the central processing unit 100 are adjacent to the signal layer 302 of the printed circuit board 300. Due to wiring layout, electrical signals going out from the central processing unit 100 may be transmitted to the north bridge 200 via any one of the signal layers (such as the signal layer 108 or the signal layer 114) of the central processing unit 100. The north bridge 200 may use any one of the signal layers (such as the signal layer 206 or the signal layer 212) to receive or to respond. The printed circuit board 300 serves as a signal transmission interface between the central processing unit 100 and the north bridge 200. When the central processing unit 100 issues an electrical signal, any one of the signal layers (such as the signal layer 302 or the signal layer 308) within the printed circuit board 300 may be selected to conduct the signal transmission.

Although the aforementioned wiring layout dispenses with the need to route electrical signals within a particular signal layer to a specific signal layer, such a design often lead to an increase in the probability of corruption of the electrical signal along the transmission route. For most devices, such conditions may not cause any unexpected side effect to the electrical signals. However, the central processing unit 100 and the north bridge 200 are both fast and voluminous signal transmitters, and most transmissions involve critical signals including address signals, data signals and strobe signals. Hence, any minor deterioration of signal quality may seriously affect the operation of the entire system.

In addition, a circuit path is created whenever signals are transmitted from the central processing unit 100 to the control chip 200 or vice versa. The circuit path includes a return path that is often referred to as a reference layer. The return path may be a ground layer such as 110, 306 or 210 (represented by dash line in FIG. 1) or the return path may be a power source layer such as 112, 304 and 208. Everything depends on whether the transmitted signal follows the first signal layer such as 108, 302, 206 or the second signal layer such as 114, 308, 212. A signal usually selects a return path closest to the signal transmission layer and having the smallest resistance. Hence, if the signal chooses the first signal layer, the ground layer is used as a reference layer to form the return path. On the other hand, if the signal chooses the second signal layer, the power source layer is used as a reference layer to form the return path.

The constituent pathway of the return path may directly affect the quality of the signal transmission. Signal timing may be less stable if the return path is a power source layer rather than a reference ground layer. The power source layer provides a less stable return effect because the power source layer also serves as a voltage source for driving other devices.

The aforementioned printed circuit board has four layers. In practice, the total number of layers in a printed circuit board stack may be as many as 6 to 9. Hence, the actual cost of producing of a printed circuit board is much higher than the one illustrated.

SUMMARY OF THE INVENTION

Accordingly, one object of the present invention is to provide a data processing system linking up a central processing unit, a control chip and a four-layered printed circuit board such that signal transmission is stabilized and production cost of the printed circuit board is reduced.

To achieve these and other advantages and in accordance with the purpose of the invention, as embodied and broadly described herein, the invention provides a data processing system and associated control chip and printed circuit board. The printed circuit board not only supports the control chip and the central processing unit, but also serves as an interface for transferring signals between the control chip and the central processing unit.

The control chip includes a substrate having a stack structure. The substrate stack structure comprises, in sequential order, a first signal layer, a first reference layer at a first reference voltage, a second reference layer at a second reference voltage and a second signal layer.

The central processing unit includes a substrate having a stack structure including, in sequential order, a third signal layer, a third reference layer at the first reference voltage, a fourth reference layer at the second reference voltage and a fourth signal layer.

The printed circuit board also has a stack structure including, in sequential order, a fifth signal layer, a fifth reference layer at the first reference voltage, a sixth reference layer at the second reference voltage and a sixth signal layer. The second signal layer of the control chip and the fourth signal layer of the central processing unit are adjacent to the fifth signal layer of the printed circuit board.

When a critical signal needs to be transferred from the central processing unit to the control chip, the best possible return path will be the one via the third signal layer, the fifth signal layer and the first signal layer.

This invention also provides a data processing method. This method makes use of the aforementioned stack structure of the central processing unit to design a wiring layout. A printed circuit board for supporting the central processing unit and a control chip are provided. The stack structures of the printed circuit board and the control chip are identical to that in the aforementioned data processing system. The layers are linked together such that the second signal layer of the control chip and the fourth signal layer of the central processing layer are adjacent to the fifth signal layer of the printed circuit board.

Signals from the central processing unit are classified into critical and non-critical signals and a better return path is provided for all the critical signals. Critical signals from the central processing unit are sent to the control chip via the first signal layer, the third signal layer and the fifth signal layer.

In brief, a printed circuit board having a stack of four layers is used in this invention to reduce production cost. Additionally, the wiring layout serving as a transmission path for critical signals only uses the first signal layers of the aforementioned substrate stacks concerned with the central processing unit and the control chip, and in accompanied with the first signal layer of the printed circuit board. Hence, the critical signals will be transferred under best transmission qualities due to the affections by charge flows from the power source layer are eliminated.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
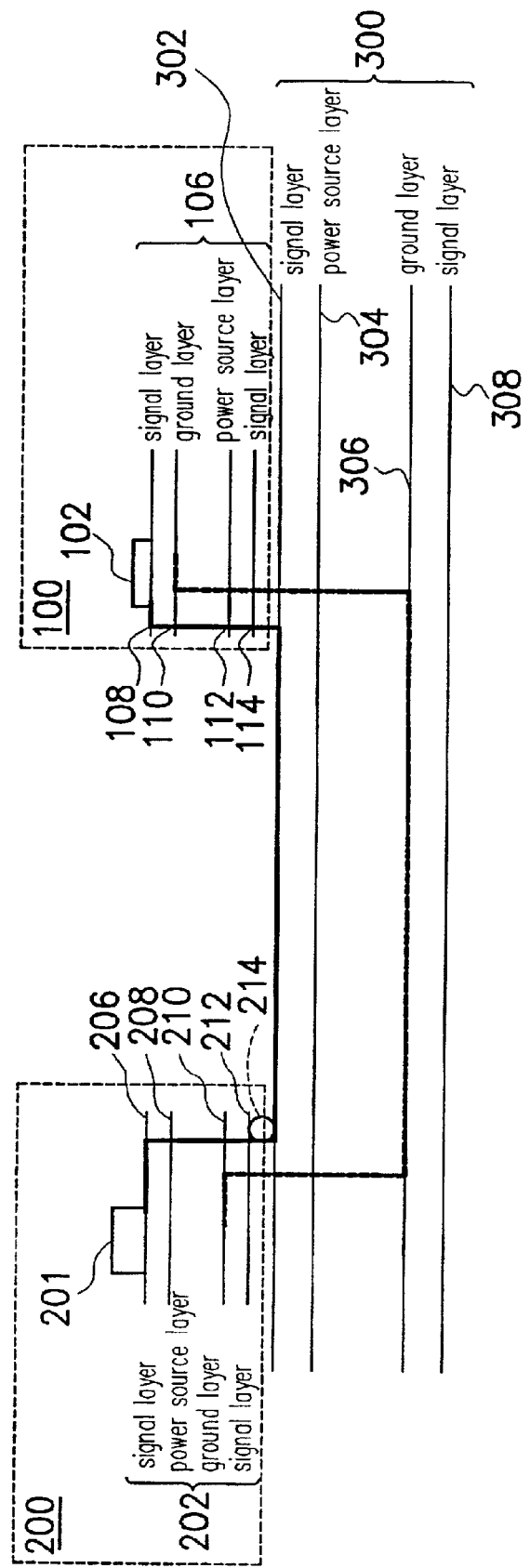
FIG. 1 is a schematic diagram showing a conventional signal transmission wiring system among a central processing unit, a north bridge and a printed circuit board.

Reference will now be made in detail to the present preferred embodiments of the invention, examples of which are illustrated in the accompanying drawings. Wherever possible, the same reference numbers are used in the drawings and the description to refer to the same or like parts.

Figure 2:
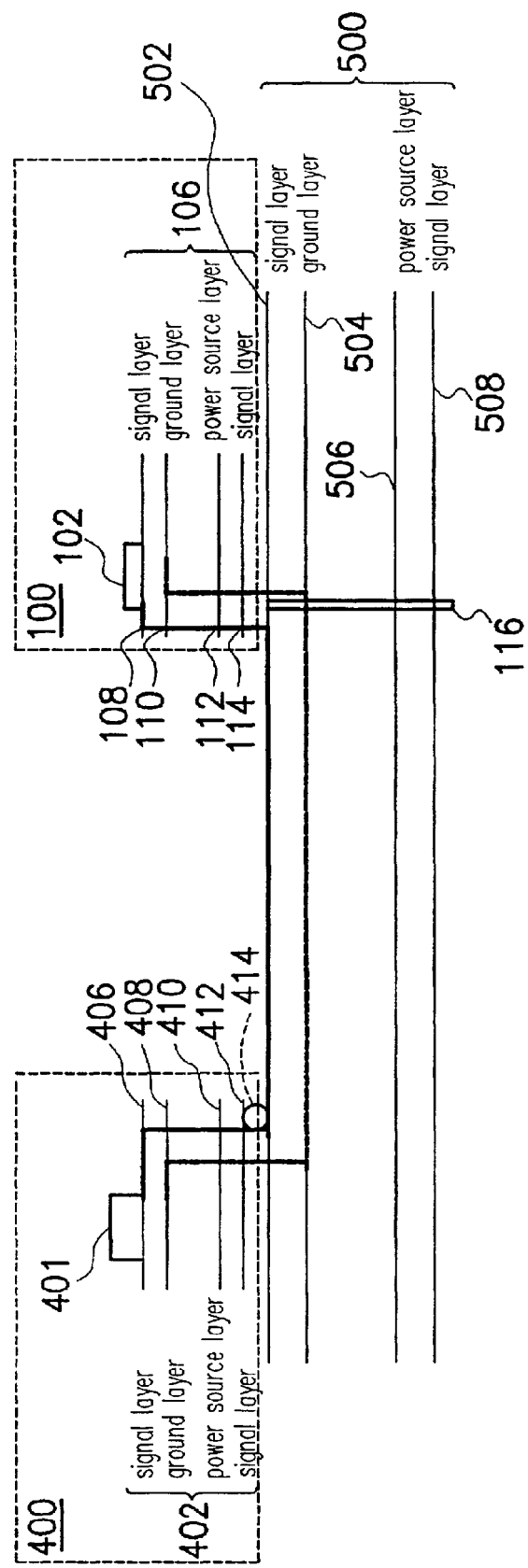
FIG. 2 is a schematic diagram showing a signal transmission wiring system among a central processing unit, a north bridge and a printed circuit board according to one preferred embodiment of this invention.

FIG. 2 is a schematic diagram showing a signal transmission wiring system between a central processing unit, a north bridge and a printed circuit board according to one preferred embodiment of this invention. The system includes a printed circuit board (PCB) 500, a central processing unit (CPU) 100 and a control chip 400. The printed circuit board 500 or the motherboard supports the central processing unit 100 such as an Intel Pentium IV. The central processing unit 100 has a plurality of contacts that connect a chip 102 to a substrate 106. The entire central processing unit 100 uses a plurality of through holes (or, vias) 116 that pass through the printed circuit board 500 for electrical connection. The control chip 400 (such as a north bridge) is a ball grid array (BGA) package that uses a plurality of solder balls 414 to contact bonding pads on the printed circuit board 500. The control chip 400 includes a chip 401 above a substrate 402.

The substrate 106 inside the central processing unit 100 has a stack structure that includes, in sequential order below the chip 102, a signal layer 108, a reference layer 110 at a first reference voltage such as ground voltage, a reference layer 112 at a second reference voltage such as a power source voltage and a signal layer 114. The reference layer 110 is a ground layer (the reference layer 110 is referred to as the ground layer 110 from now on) while the reference layer 112 is a power source layer (the reference layer 112 is referred to as the power source layer 112 from now on).

To ensure uniform and stable signal transmissions between the central processing unit 100 to the control chip 400, the substrate 402 of the control chip 400 has a stack structure corresponding to that of the central processing unit 100. Therefore, the layers constituting the substrate stack 402 of the control chip 400 include, form top to bottom, a signal layer 406, a ground layer 408 at the first reference voltage (a ground voltage), a power source layer 410 at the second reference voltage (a power source voltage) and a signal layer 412. As know by an ordinary person having skills in the art, there are many components or devices mounted on the PCB 500 (such as memory, extension slots, etc.), while some of them are concerned with the disclosed data processing system. For example, the control chip 400 such as a north bridge control chip basically couples to the central processing unit 100, a memory slot (for receiving memory modules), a south bridge control chip, and an AGP (accelerated graphic peripheral) device, while these devices usually require different power potentials for operations. Therefore the control chip 400 should provide different power potentials for transferring associated signals to these devices. To achieve the above requirements, the power source layer 410 usually consists of several partitions that respectively provide different reference voltages for different devices aforementioned. For simplification purpose, only "the second reference voltage" is used in the embodiment.

Furthermore, for the purpose of ensuring uniform and stable signal transmission between the central processing unit 100 to the control chip 400, the printed circuit board 500 that serves as a signal transmission interface between the central processing unit 100 and the control chip 400 also encompasses a similar stack structure. The layers constituting the printed circuit board 500 include, from top to bottom, a signal layer 502, a ground layer 504 at the first reference voltage (a ground voltage), a power source layer 506 at the second reference voltage (a power source voltage) and a signal layer 508.

As shown in FIG. 2, the data processing system of this invention includes the central processing unit 100, the control chip 400 and the printed circuit board 500. The layers are arranged such that the signal layer 412 of the control chip 400 and the signal layer 114 of the central processing unit 100 are adjacent to the signal layer 502 of the printed circuit board 500.

In this embodiment, critical signals such as address signals, data signals and strobe signals from the central processing unit 100 demand a better return path. Hence, these signals are passed from the central processing unit 100 to the control chip 400 via the signal layer 108 of the central processing unit 100, the signal layer 502 of the printed circuit board 500 and the signal layer 406 of the control chip 400.

Since critical signals are transmitted at a high frequency between the central processing unit 100 and the control chip 400, these are the signals in the computer system that demand the highest transmission stability. Using the wiring layer according to this invention, critical signals are transmitted along the first signal layers of the central processing unit 100, the printed circuit board 500 and the control chip 400, respectively. With a shorter traveling distance than before, cumulative interference due to noise is greatly reduced. For example, interference of signal traversing through the signal layer 508 of the printed circuit board 500 arisen by charges flowing inside the power source layer 506 will be less than before. However, to maximize transmission efficiency, non-critical signals such as memory address (MA) signals and control signals (SCAS, SRAS, SWE and so on) may be transmitted via noisier signal layers (such as 412, 508 and 114).

In the meantime, signals choose a return path closest to the signal transmission layer and having smallest resistance. Hence, when electrical signals travel through the first signal layers among the central processing unit 100, the printed circuit board 500 and the control chip 400, a return path through the ground layers of the control chip 400, the printed circuit board 500 and the central processing unit 100 is created leading to a greater stability for the transmitted signals.

Figure 3:
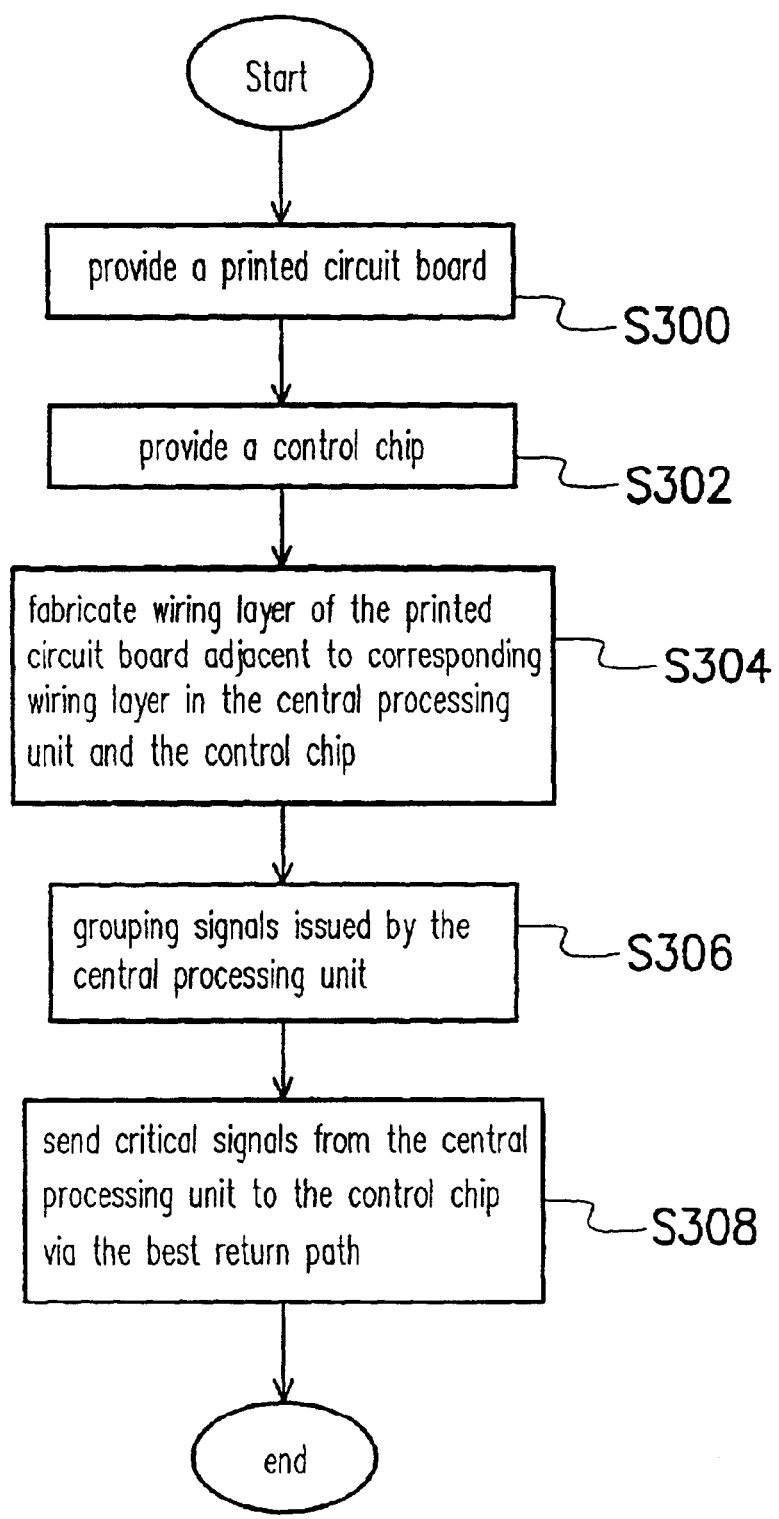
FIG. 3 is a flow chart showing steps for forming a wiring layout that integrates a central processing unit, a control chip and a printed circuit board together according to another preferred embodiment of this invention.

FIG. 3 is a flow chart showing steps for forming a wiring layout that integrates a central processing unit, a control chip and a printed circuit board together according to another preferred embodiment of this invention. First, a printed circuit board 500 (in step s300) and a control chip 400 (in step s302) are provided. The layers within the central processing unit 100, the control chip 400 and the printed circuit board 500 are fabricated in such a way that the signal layer 114 of the central processing unit 100 and the signal layer 412 of the control chip 400 are adjacent to the signal layer 502 of the printed circuit board 500 as the embodiment aforementioned (in step s304).

Since the central processing unit 100 may issue a large number of electrical signals, signals from the central processing unit 100 are classified into critical and non-critical signals according to whether a better return path is demanded (in step s306). Critical signals are mostly high frequency signals that include address signals, data signals and strobe signals. A better return path refers to a path having a reference voltage immune to local electric charge fluctuations.

After sorting out the electrical signals emitted by the central processing unit 100, critical signals are sent to the control chip 400 via the signal layer 108 of the central processing unit 100, the signal layer 502 of the printed circuit board 500 and the signal layer 406 of the control chip 400 (in step s308).

In conclusion, the present invention takes the advantages of establishing stack structures of a PCB and a control chip that corresponds with that of the central processing unit, and transferring all critical signals between the control chip (e.g., north bridge chip of a conventional chipset) and CPU via the first signal layer of PCB. Furthermore, both the control chip and CPU transmit these critical signals also via their first signal layers of associated stack structures. Unwanted charge interference is thus reduced and the signal transmission performance from the central processing unit to the control chip will be optimized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data processing system, comprising:

a control chip having a substrate therein;

a central processing unit having a substrate therein; and a printed circuit board;

wherein the control chip substrate, the central processing unit substrate and the printed circuit board all contain a plurality of layers, arranged in sequential order from top to bottom, including a first signal layer, a first reference layer at a first reference voltage, a second reference layer at a second reference voltage and a second signal layer such that the first signal layer of the printed circuit board is adjacent to the second signal layer of the control chip substrate and the second signal layer of the central processing unit substrate.

2. The system of claim 1, wherein critical signals issued by the central processing unit include address signals, data signals and strobe signals.

3. The system of claim 1, wherein the first reference layer of the control chip and the first reference layer of the printed circuit board are ground layers and the first reference voltage is a ground voltage, wherein the second reference layer of the control chip and the second reference layer of the printed circuit board are power source layers and the second reference voltage is a power source voltage.

4. A printed circuit board for supporting a control chip and a central processing unit, wherein the control chip has a stack structure that includes, from top to bottom, a first signal layer, a first reference layer at a first reference voltage, and reference layer at a second reference voltage and a second signal layer, and the central processing unit has a substrate containing a stack structure that includes, from top to bottom, a third signal layer, a third reference layer at the first reference voltage, a fourth reference layer at the second reference voltage and a fourth signal layer, the printed circuit board comprising, in sequential order from top to bottom:

a fifth signal layer;

a fifth reference layer at the first reference voltage;

a sixth reference layer at the second reference voltage; and a sixth signal layer;

wherein critical signals from the central processing unit are transmitted to the control chip via the third signal layer, the fifth signal layer and the first signal layer.

5. The printed circuit board of claim 4, wherein critical signals include address signals, data signals and strobe signals.

6. The printed circuit board of claim 4, wherein the first reference layer, the third reference layer and the fifth reference layer are ground layers and the first reference voltage is a ground voltage, wherein the second reference layer, the fourth reference layer and the sixth reference layer are power source layers and the second reference voltage is a power source voltage.

7. A control chip supported by a printed circuit board wherein the printed circuit board supports a central processing unit, the central processing unit has a stack structure that includes, in sequential order from top to bottom, a first signal layer, a first reference layer at a first reference voltage, a second reference layer at a second reference voltage and a second signal layer, the printed circuit board contains a stack structure that includes, in sequential order from top to bottom, a third signal layer, a third reference layer at the first reference voltage, a fourth reference layer at the second reference voltage and a fourth signal layer, the control chip has a stack structure comprising, in sequential order from top to bottom:

a fifth signal layer;

a fifth reference layer at the first reference voltage;

a sixth reference layer at the second reference voltage; and a sixth signal layer, wherein the sixth signal layer of the control chip couples with the second signal layer of the central processing unit via the third signal layer of the printed circuit board, and critical signals from the central processing unit are transmitted to the control chip via the first signal layer, the third signal layer and the fifth signal layer.

8. The control chip of claim 7, wherein critical signals include address signals, data signals and strobe signals.

9. The control chip of claim 7, wherein the first reference layer, the third reference layer and the fifth reference layer are ground layers, the first reference voltage is a ground voltage, the second reference layer, the fourth reference layer and the sixth reference layer are power source layers, and the second reference voltage is a power source voltage.

* * * * *